(12) United States Patent
Ohno et al.

(10) Patent No.: US 6,292,346 B1
(45) Date of Patent: Sep. 18, 2001

(54) EQUIPMENT FOR HOLDING A SEMICONDUCTOR WAFER, A METHOD FOR MANUFACTURING THE SAME, AND A METHOD FOR USING THE SAME

(75) Inventors: Masashi Ohno, Nagoya; Hirokazu Ichikawa, Kuwana-Gun; Naohito Yamada, Kasugai; Tetsuya Kawajiri, Ichinomiya, all of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/357,395

(22) Filed: Jul. 20, 1999

(30) Foreign Application Priority Data

Jul. 24, 1998 (JP) .................................................. 10-209449

(51) Int. Cl.[7] .................................................. H02N 13/00
(52) U.S. Cl. .......................................... 361/234; 29/592.1
(58) Field of Search .................................. 361/230–235; 279/128; 29/592.1

(56) References Cited

U.S. PATENT DOCUMENTS

| | | | |
|---|---|---|---|
| 5,946,183 | * | 8/1999 | Yamada et al. ........................ 361/234 |
| 5,998,320 | * | 12/1999 | Yamada et al. ........................ 501/98.4 |
| 6,134,096 | * | 10/2000 | Yamada et al. ........................ 361/234 |

FOREIGN PATENT DOCUMENTS

| | | |
|---|---|---|
| 59-124140 | 7/1984 | (JP) . |
| 3-3249 | 1/1991 | (JP) . |
| 3-108737 | 5/1991 | (JP) . |
| 9-17849 | 1/1997 | (JP) . |

* cited by examiner

Primary Examiner—Michael J. Sherry
(74) Attorney, Agent, or Firm—Parkhurst & Wendel, L.L.P.

(57) ABSTRACT

A semiconductor wafer-holder having a member for holding the semiconductor wafer with a basic member made of a ceramic nitride, a cooling equipment made of a metal, and an intervened layer between the semiconductor wafer-holding member and the cooling equipment, the intervened layer being composed of a metallic foil or a carbon sheet having a thickness of not more than 500 μm.

5 Claims, 2 Drawing Sheets

EQUIPMENT FOR HOLDING A SEMICONDUCTOR WAFER, A METHOD FOR MANUFACTURING THE SAME, AND A METHOD FOR USING THE SAME

BACKGROUND OF THE INVENTION

1. Field of the invention

This invention relates to a semiconductor wafer-holder, a method for manufacturing the same, and a method for using the same.

2. Related Art Statement

In a semiconductor-manufacturing step such as CVD, sputtering, etching, a semiconductor wafer is set onto a susceptor and heated by heating the susceptor. JP-A-59-124140 discloses that recently, in that case, an electrostatic chuck is used as the susceptor and the semiconductor wafer is heated, while attracted to the susceptor. Moreover, it is known that a heater made of a ceramic material is used as the susceptor, and the semiconductor wafer is directly heated, set onto the ceramic heater. For increasing a production volume of semiconductors, however, the prevention of the temperature change in attracting and releasing cycle of the semiconductor wafer on the susceptor requires heating and cooling the wafer with good responsibility. Thus, an equipment for cooling the wafer is required to be combined to the susceptor.

JP-A-3-3249 suggests a technique of combining the electrostatic chuck to a metallic cooling board of a water cooling type with metallic bonding. In the above technique, the electrostatic chuck made of alumna is bonded to the water cooling board made of aluminum with indium. However, a melting point of indium is about 160° C. and a temperature range usable as indium is at most 150° C. and below, is small, so that indium has an only small temperature range usable for an equipment for manufacturing a semiconductor. The inventors tried to bond the electrostatic chuck and the water cooling board with a metallic wax having a higher melting point, but after bonding, large remaining stresses occur at their boundary, resulting from a difference in heat expansion between a ceramic material and a metal composing the electrostatic chuck and the water cooling board, respectively, and destroyed the electrostatic chuck. Thus, bonding the electrostatic and the water cooling board is difficult. Needless to say, the remaining stresses can be reduced by bonding with a metal having a low melting point such as indium, but as above mentioned, it make the available temperature range small. It can be also conceived to bond the electrostatic chuck and the water cooling board with a resin, but the resin has such a poor heat-resistance that it make the available temperature range very small.

Moreover, JP-A-3-108737 suggests that a path for a refrigerant is formed in a midst ceramic layer of an electrostatic chuck having plural ceramic layers and a surface temperature of the electrostatic chuck is decreased by making flow the refrigerant through the path. However, a quantity of heat resulting from a plasma and electron beams enters a surface of the electrostatic chuck, which heats the surface of the electrostatic chuck. If a basic member of the electrostatic chuck is made of ceramic material having a low thermal conduction and a high dense plasma is employed, a surface temperature of the basic material would arise to a temperature of 700° C. to 800° C. and thereby the basic member is likely to be destroyed. Although the refrigerant is made flow through its path for controlling the surface temperature depriving of the heat therein, in this case, a temperature difference occurs in between the surface of the electrostatic chuck and the path for the refrigerant. Particularly, the generation of the plasma in the surface side of the electrostatic chuck make the temperature difference be large. Thus, it is becoming clear that since a temperature inclination inside the electrostatic chuck is remarkably increased and thereby, large thermal stresses occur, the basic member made of ceramic material is likely to be destroyed.

Moreover, the inventors disclosed in JP-A-7-161,957 that an intervened layer, composed of a binding body of fibers made of thermal resistant material or an expanded body, is formed between a susceptor having a basic member made of ceramic nitride and a metallic cooling equipment, and the intervened layer is pressurized to conduct a heat. The method is an excellent measure in a view of preventing the above problem, but in the case of enhancing the quantity of heat to the semiconductor wafer from the plasma, cooling efficiency is not sufficient.

SUMMARY OF THE INVENTION

It is an object of the present invention to use a susceptor in a high temperature range, particular 200° C. and over, control its temperature, prevent the susceptor from being destroyed, and control the susceptor's temperature in constant even though a quantity of heat to the susceptor is increased, in a controlling technique of a surface temperature of the susceptor made of a ceramic material and further a temperature of a semiconductor wafer by depriving of their quantities of heat with a metallic refrigerant.

This invention relates to a semiconductor wafer-holder comprising a member for holding the semiconductor wafer with a basic member made of a ceramic nitride, a cooling equipment made of a metal, and an intervened layer between the semiconductor wafer-holding member and the cooling equipment, the intervened layer being composed of a metallic foil or a carbon sheet having a thickness of not more than 500 $\mu$m.

This invention also relates to a method for manufacturing a semiconductor wafer-holder comprising the steps of forming a member for holding a semiconductor wafer with a basic member made of ceramic nitride, forming a cooling equipment made of metal, forming an intervened layer composed of a metallic foil or a carbon sheet having a thickness of not more than 500 $\mu$m between the semiconductor wafer-holding member and the cooling equipment, while sandwiched by them, and combining, fastening them mechanically, the semiconductor wafer-holding member, the cooling equipment, and the intervened layer.

This invention further relates to a method for using a semi-conductor wafer-holder having a semiconductor wafer-holding member with a basic member made of ceramic nitride, a cooling equipment made of metal, and an intervened layer composed of a metallic foil or a carbon sheet having a thickness of not more than 500 $\mu$m, sandwiched by the semiconductor wafer-holding equipment and the cooling equipment, comprising the steps of controlling a quantity of heat to be transmitted to between the semiconductor wafer-holding equipment and the cooling equipment by controlling its pressure while pressurizing the intervened layer.

The inventors have found, in the process of repeating experiments to investigate thermal conductance in the semiconductor wafer-holding equipment having the semiconductor wafer-holding member, the metallic cooling equipment and the intervened layer composed of the binding body of fibers made of a thermal resistant material or the expanded body, that in the case of a normal quantity of heat for the semiconductor wafer, the destruction of the member is prevented and a temperature of the member can be controlled in stable so that it may be constant, but in the case of increasing the quantity of heat for the semiconductor wafer and making it 1.6kW, for example, a temperature of the member is increased and may be difficult to be controlled.

Based on the above finding, the inventors have successfully developed a technique that if the quantity of heat for the semiconductor wafer is increased, it can be conducted to the cooling equipment in high efficiency and thereby its destruction and occurrence of cracks in the semiconductor wafer-holding member made of a ceramic material can be prevented. That is, they have formed the intervened layer composed of a metallic foil or a carbon sheet with not more than 500 $\mu$m thickness, between the semiconductor wafer-holding member having a basic member made of a ceramic nitride and the metallic cooling equipment.

As above mentioned, the temperature inclination inside the ceramic basic member composing the semiconductor wafer-holding member such as an electrostatic chuck have to be prevented. If the temperature inclination occurs in the ceramic basic member, it may be cracked up. It means that by making a large temperature inclination in the intervened layer, not in ceramic basic member, the temperature difference between the cooling equipment and the ceramic basic member have to be diminished.

The inventors thought in the past that a thickness of the intervened layer have to be large, for example, not less than 1 mm, for making the temperature inclination to absorb the temperature difference between the cooling equipment and the semiconductor wafer-holding member. Moreover, they thought that the metallic foil reflects a heat, so it can not conduct the heat. On the other hand, if the metallic foil become thicker, it is unlikely to be deformed and thereby it has difficulty in conducting the heat and it cannot conduct the heat uniformly, so that it may induce a temperature distribution in the ceramic basic member and internal stresses in the ceramic basic member due to the temperature distribution may destroy itself. Thus, they have believed that the metallic foil and the carbon sheet can not employed.

The inventors found, however, that in fact, if only the metallic foil is deformed when it is thinner, an internal temperature inclination in the metallic foil is large and the quantity of heat to be conducted is large, so that the temperature inclination in the ceramic basic member is almost diminished. They have conceived this invention based on the above finding. They have also conceived that when a thinner carbon sheet is employed, an efficiency of heat conduction is further enhanced due to fine deformation of the carbon sheet, besides the above effects.

The intervened layer have to be composed of the metallic foil or the carbon sheet and formed in a thickness of not more than 500 $\mu$m.

The intervened layer follows surface warps between the semiconductor wafer-holding member and the cooling equipment, makes good thermal conduction, and makes a large temperature inclination therein. Accordingly, the thickness of the intervened layer is preferably not more than 300 $\mu$m, more preferably not more than 50 $\mu$m.

In manufacturing a semiconductor wafer-holder, the semiconductor wafer-holding member and the cooling equipment may be mechanically fastened and combined. Moreover, by pressurizing the intervened layer and controlling its pressure, a quantity of heat between the semiconductor wafer-holding member and the cooling member may be controlled.

BRIEF DESCRIPTION OF THE DRAWINGS

For a better understanding of this invention, reference is made to the attached drawings, wherein.

DESCRIPTION OF THE PREFERRED EMBODIMENTS

Figure 1:
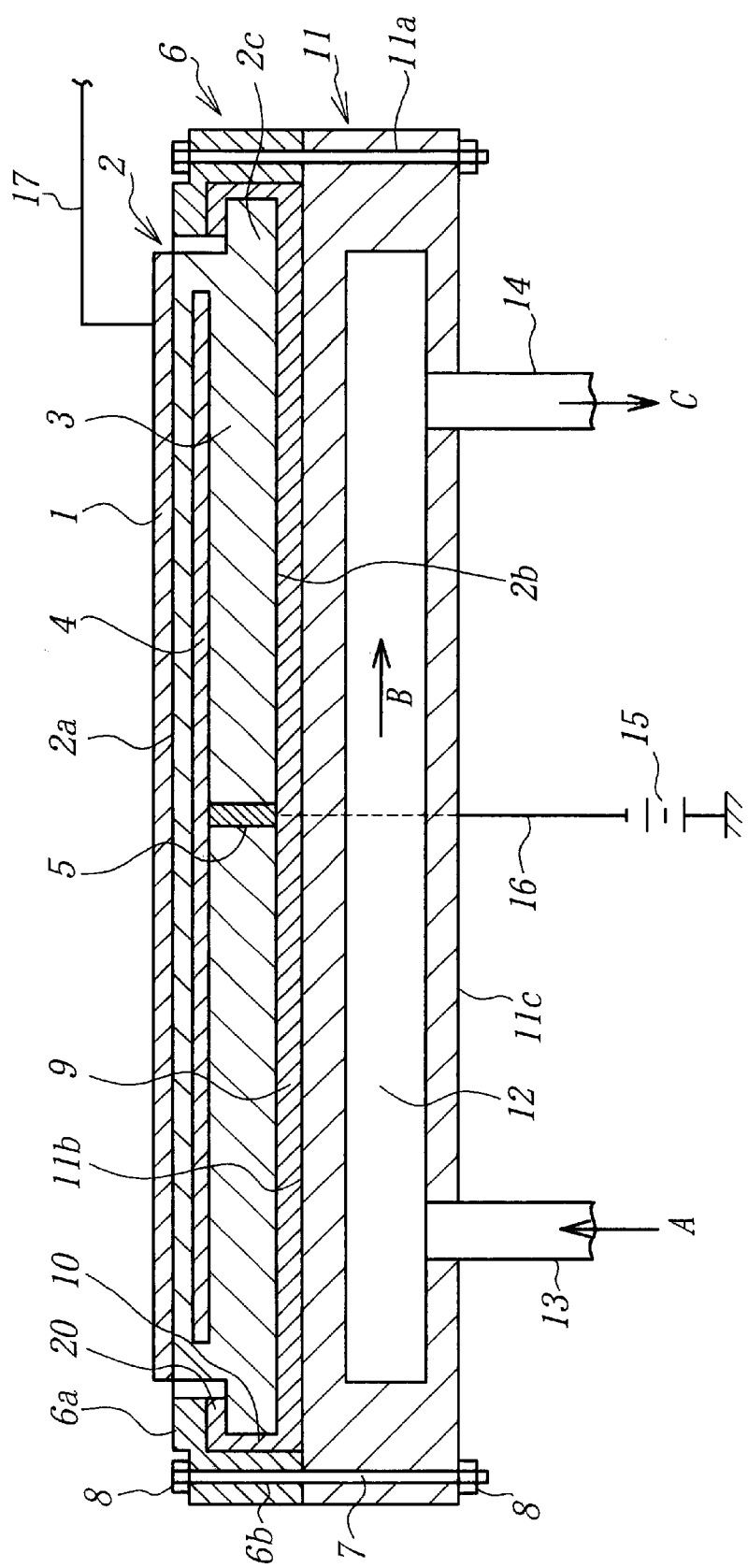
FIG. 1 is a cross sectional view schematically showing a semiconductor wafer-holder having an intervened layer 9 between an electrostatic chuck and a cooling equipment in an embodiment according to the present invention.

A ceramic nitride with a high thermal conductivity is suited for a ceramic material composing the basic member of the semiconductor wafer-holding equipment. Although a ceramic oxide such as alumina has low thermal conductivity, accumulates heats from a plasma, and is likely to increase its temperature excessively, aluminum nitride has a thermal conductivity of not less than 90 w/m·K. As the above ceramic nitride, silicon nitride or SiAlON may be preferably used in view of thermal resistance. Moreover, when a member of aluminum nitride is exposed to a fluorine based corrosive gas such as $NF_3$, a passivative film made of $AlF_3$, having corrosive resistance to a halogen based corrosive gas, is formed on its surface.

If only the semiconductor wafer-holding member operate as a susceptor to set the semiconductor wafer, it may have another function. For example, the semiconductor wafer-holding member may be used as an electrostatic chuck if an electrode for an electrostatic chuck is formed in its basic member. Moreover, it may be used as a ceramic heater if a resistance heater is formed in its basic member. Furthermore, it may be used by itself as an electrode for generating a plasma if a plasma-generating electrode is formed in its basic member. Concrete embodiments are explained in the specification of JP-A-7-161,957.

In the case of forming a conductive member such as the electrode or the heater in the basic member of the holding equipment and supplying an electric power to the conductive member, terminals are preferably formed in the basic member and connected to the conductive member. The terminals and the conductive member are preferably made of a metal with a high melting point such as tungsten, molybdenum, platinum, nickel or an alloy composed of those metals.

When the conductive member is composed of the electrostatic chuck's electrode, it may be formed in a plate-like shape or a netlike shape. The electrode may be unipolar or bipolar.

An electrode to be embedded in the basic member is preferably a bulky and sheet-like electrode and the basic member to surround the sheet-like electrode is a sintered body as one body without joining faces. The wording "a bulky and sheet-like electrode" means an electrode formed, as one body of wires or plates, in a plate-like shape without arranging them in a spiral shape or in a zigzag shape.

Although the electrode may be composed of a metallic plate, it is preferably a plate composed of a bundle of metallic wires or a plate having many pores. Consequently, in a step of sintering the basic member, ceramic powders flow, enter the pores of the plate, and fill them up, which makes binding powers of the ceramic powders be large in both sides of the plate and makes a strength of the basic member enhanced. As the above plate, a punching metallic body, a metallic net, or a felt may be employed.

A plasma-generating equipment is formed by embedding a resistance heater made of a metal with a high melting point into the basic member. A surface to generate a plasma of the basic member is heated by supplying an electric power to the resistance heater. Consequently, the semiconductor wafer is heated directly in a state that the wafer is set and held on an electrode for generating the plasma, so that the uniformity and responsibility of the heating can be developed. Particularly, if the wafer is preheated just before generating the plasma and the electric power for the resistance heater is reduced at the same time of the generating the plasma, a temperature of the wafer may be maintained constant, irrelevant to the plasma.

The metallic foil composing the intervened layer is preferably made of nickel, aluminum, copper, brass, stainless steel, or an alloy of those metal. Particularly, when the intervened layer is exposed to a corrosive gas in a semiconductor-manufacturing equipment, the above metal or alloy may be preferably used.

Although the cooling equipment may be formed of every kind of metal, it is preferably made of aluminum, copper, stainless steel, or nickel when it is exposed to a halogen based corrosive gas.

As a refrigerant usable for the cooling equipment, a liquid such as water, silicone oil or a gas such as air, inert gas may be used. Its flow rate can be selected appropriately by persons skilled in the art.

The cooling equipment and the semiconductor wafer-holding member may be conventionally mechanically fastened. Moreover, the intervened layer may be bonded to the cooling equipment or the holding member, but it is not always necessary.

The semiconductor wafer-holder may be used for manufacturing or processing a semiconductor element, a liquid crystal panel, a silicon-single crystalline wafer, etc.

FIG. 1 is a cross sectional view showing an embodiment of a semiconductor wafer-holder in which an electrostatic chuck is employed as a member for holding a semiconductor wafer. An electrode 4 of an electrostatic chuck is embedded in a basic member 3 of an electrostatic chuck 2 and a semiconductor wafer 1 is set on a surface 2a of the basic member 3. In a side of a backface 2b opposite to the surface 2a, circular flanges 2c are formed elongating toward a sideface of the basic member 3. A terminal 5 is embedded in the basic member 3, one end of the terminal 5 being connected to the electrode 4, the other end of the terminal 5 being exposed to the backface 2b.

A cooling equipment 11 is set in a side of the backface 2b of the electrostatic chuck 2. A refrigerant path 12 is formed in between a surface 11b and a backface 11c of the cooling equipment 11, and a refrigerant supplying hole 13 and a refrigerant exhausting hole 14 are formed in a side of the backface 11c. The refrigerant path 12 is preferably formed in zigzag arranging partitions or the like so that the refrigerant can flow, at almost constant flow rate, in plate-like area of the cooling equipment as viewed in a horizontal direction thereof. A metallic fixing member 6 is set on the surface 11b of the cooling equipment 11, protrusions 6a of the fixing member 6 being opposite to the flanges 2c, respectively. Piercing holes 6b of the fixing member 6 and piercing holes 11a are aligned respectively, and common bolts 7 are inserted through each of piercing holes, both ends of each of the bolts 7 being fastened with nuts 8.

An intervened layer 9 is formed between the backface 2b of the electrostatic chuck 2 and the surface 1b of the cooling equipment 11, sandwiched by them. Each of intervened layers 10 is formed between the flange 2c and the fixing member 6, respectively, sandwiched by them. Each of intervened layers 20 is formed between the flange 2c and the protrusion 6a of the fixing member 6, respectively, sandwiched by them. An electric wire 16 is connected to the terminal 5 and one polar terminal of a DC power source 15. The other terminal of the source or an earth is connected to the semiconductor wafer 1 through an electric wire 17.

In processing the semiconductor wafer, the semiconductor wafer 1 is set onto the surface 2a and attracted to it by supplying an electric power to the electrostatic chuck's electrode 4. In that state, by generating a plasma, a film-forming such as CVD or an etching step is carried out to the semiconductor wafer. When the refrigerant is supplied to the path 12 from the refrigerant supplying hole 13 of the cooling equipment 11 as shown in an arrow A, the refrigerant flows through it approximately along an arrow B and is exhausted through the exhausting hole 14 along an arrow C. By controlling a fastening force for the bolts 7, a pressure to the intervened layer 9 can be controlled.

Figure 2:
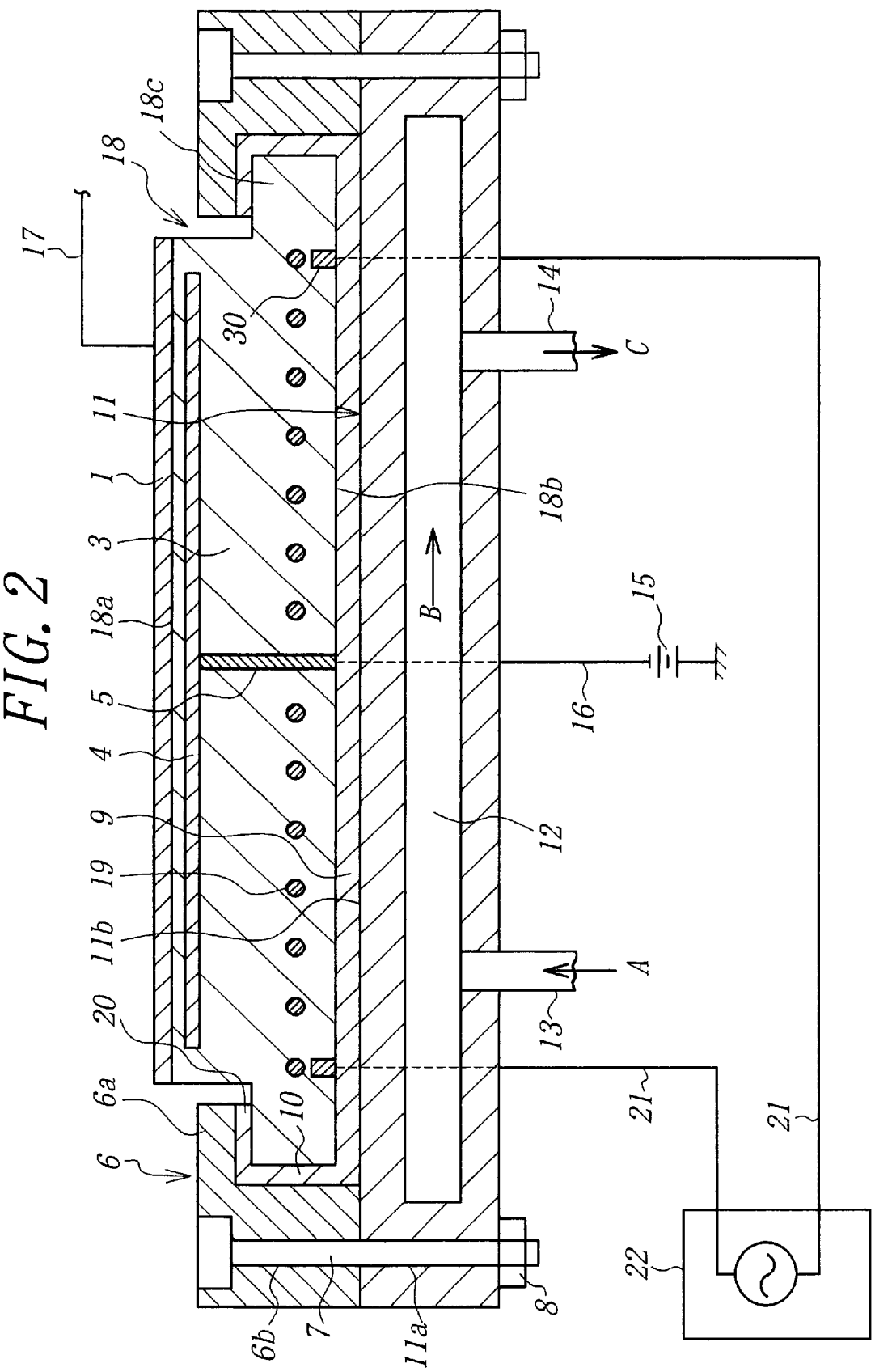
FIG. 2 is a cross sectional view schematically showing a semiconductor wafer-holder having an intervened layer 9 between an electrostatic chuck with a heater and a cooling equipment.

FIG. 2 is a cross sectional view showing a semiconductor wafer-holder further having a resistance heater embedded in an electrostatic chuck so that a semiconductor wafer can be heated, attracted to it. Like reference numerals are given to like parts in FIG. 1, and thus they may not be explained. An electrostatic chuck 18 with a heater has an electrostatic chuck's electrode 4 embedded in a side of a surface 18a of a basic member 3 and a resistance heater 19 embedded in a side of a backface 18b to the electrode 4. A pair of terminals 30 is embedded in a backside to the resistance heater 19, an end of each terminal being exposed to the backface 18b. Both ends of the resistance heater 19 are respectively connected to terminals 30 which are electrically connected to wires 21. Each of the wires 21 is connected to a electric power-supplying equipment 22 with a thyristeric regulator. A reference numeral 18c denotes flanges of the basic member.

In processing the semiconductor wafer, the semiconductor wafer 1 is set onto the surface 18a and attracted to it by supplying an electric power to the electrostatic chuck-electrode 4. Then, the resistance heater 19 is heated by the electric power and thereby the wafer 1 is heated, being attracted. In that state, the semiconductor wafer 1 is heated and processed by etching or the like. Or in the case of generating a plasma, the resistance heater is controlled so that its quantity of heat is reduced and thereby a temperature of the wafer is maintained constant, at the same time when a heat from the plasma enters the wafer.

EXAMPLES

Example 1

A semiconductor wafer-holder as shown in FIG. 1 was produced and its performance was tested. The basic member 3 of the electrostatic chuck 18 was composed of a member, made of aluminum nitride, having a diameter of 8 inches, a thickness of 10 mm, and a thermal conductivity of 150W m·k. As the intervened layer 9, a carbon sheet having a thickness of 300 $\mu$m (made by Hitachi Kasei, under a trade name of "carbofit") was employed. The cooling equipment was made of aluminum. The electrostatic chuck 18 and the cooling equipment 11 were screwed up at their eight points by a tightening torque of 6 kg·cm.

In a vacuum condition, 2.5kW of a heat generated with an external heater (not shown) was introduced from a surface side of the electrostatic chuck. It can simulate a quantity of heat of a plasma generated on a surface of the electrostatic chuck in a real semiconductor-manufacturing equipment. A water with a temperature of 10° C. as the refrigerant was made flow through the cooling equipment. When in that state, temperatures of the surface 18a and backface 18b of the electrostatic chuck and of the surface 11b of the cooling equipment were measured, they were 410° C., 403° C., and 30° C., respectively. That is, a temperature difference in the electrostatic chuck was only 7° C., so that stresses due to the temperature difference did not almost occur. Consequently, in a prolong operation, cracks etc. did not occur at all. On the other hand, the intervened layer 9 with a thickness of 300 $\mu$m had a temperature inclination of 30° C. from 403° C.

Example 2

In this example, the intervened layer 9 was composed of a copper foil having a thickness of 150 $\mu$m, instead of the above carbon sheet in Example 1, and the same manner as in Example 1 was carried out. A quantity of heat from an external heater not shown was 2.3 kW. When surface temperatures of the surface and backface of the electrostatic chuck and of the cooling equipment were measured, they were 400° C., 396° C., and 23° C. Destructions and defects in the semiconductor-holding member were not recognized.

Example 3

A semiconductor wafer-holder as shown in FIG. 2 was produced and its performance was tested. The basic member 3 of the electrostatic chuck 18 with the heater 19 was composed of a member, made of aluminum nitride, having a diameter of 8 inches, a thickness of 20 mm, and a thermal conductivity of 150 W/m·k. The resistance heater 19 was composed of a winder which is wound in a coil-spring shape. The winder was embedded in the basic member, being in a whorled shape as viewed in a vertical direction to a surface of the electrostatic chuck. As the intervened layer, a carbon sheet with a thickness of 300 $\mu$m was employed. The cooling equipment was made of aluminum. The electrostatic chuck 18 and the cooling equipment 11 were screwed up at their eight points by a tightening torque of 6 kg·cm.

The above equipment was tested in the same manner as in Example 1. 2.5 kW of a heat generated by the external heater not shown was introduced from the surface 18b of the electrostatic chuck, and at the same time, the resistance heater 19 was heated by supplying an electric power thereto, and a water with a temperature of 20° C. as the refrigerant was made flow through the path of the cooling equipment. By feeding back a surface temperature of the electrostatic chuck to a power supply, controlling an output of the power source to the resistance heater and measuring the surface temperature, it was made be 400° C., successfully. That is, a total quantity of heat transmitted to the basic member from the resistance heater in the electrostatic chuck is balanced to an absorption of heat from the backface 18b by the refrigerant through the cooling equipment, and thereby the surface temperature of the electrostatic chuck can be controlled in stable, successfully.

Comparative Example 1

In this example, the electrostatic chuck was mechanically fastened to the cooling equipment without the intervened layer, and in such a state, a semiconductor wafer-holding equipment was tested in a vacuum condition, as in Example 1. When a quantity of heat to be introduced was 2.0kW, a temperature of the electrostatic chuck was over 500° C. For a contacting area of between the electrostatic chuck and the cooling equipment is small, having difficulty in transmitting the heat of the chuck to the cooling equipment.

Comparative Example 2

In this example, the intervened layer 9 was composed of a copper foil having a thickness of 1 mm, instead of the above carbon sheet in Example 1, and the same manner as in Example 1 was carried out. When a quantity of heat from the heater was 2.3 kW, a temperature of the electrostatic chuck was over 500° C. For the contacting area of between the electrostatic chuck and the cooling equipment is small because the intervened layer is composed of a unchangeable metallic board, and thereby the heat is unlikely to be transmitted to the cooling equipment.

Comparative Example 3

In this example, the intervened layer 9 was composed of a nickel fibered porous body (made by Nihon Seisen Co. Ltd., under a trade name of "CNP nickel mat"), instead of the above carbon sheet in Example 3, and the same manner as in Example 3 was carried out in a vacuum condition. A quantity of heat from the external heater was 2.0 kW. A surface temperature of the electrostatic was tried to be 400° C., but an output of the resistance heater in the electrostatic chuck was 0 and the surface temperature was over 450° C. It is considerable that since the fibered porous body has a large porosity of 93% to 98%, a quantity of heat to be transmitted to the cooling equipment was insufficient. Thus, when the quantity of heat was very large, the heat in the basic member by the refrigerant through the cooling equipment was absorbed insufficiently and the surface temperature of the electrostatic chuck can not be controlled at a constant temperature not more than 400° C.

As above mentioned, according to the present invention, in a technique of controlling a surface temperature of a susceptor made of a ceramic material by absorbing a heat therefrom with a refrigerant made of a metal, a semiconductor wafer-holding member can be thermally controlled at a high temperature range, and prevented from being destroyed. Moreover, when a quantity of heat to the semiconductor wafer-holding member is increased, its temperature can be controlled constant.

What is claimed is:

1. A semiconductor wafer-holder comprising a member for holding the semiconductor wafer with a basic member made of a ceramic nitride, a cooling equipment made of a metal, and an intervened layer between the semiconductor wafer-holding member and the cooling equipment, the intervened layer being composed of a metallic foil or a carbon sheet having a thickness of not more than 500 $\mu$m.

2. A semiconductor wafer-holder as defined in claim 1, wherein the metallic foil or the carbon sheet has a thickness of 50 $\mu$m to 300 $\mu$m.

3. A semiconductor wafer-holder as defined in claim 1, wherein the carbon sheet has a porosity of not more than 50%.

4. A method for manufacturing a semiconductor wafer-holder comprising the steps of:

forming a member for holding a semiconductor wafer with a basic member made of a ceramic nitride, forming a cooling equipment made of a metal, forming an intervened layer composed of a metallic foil or a carbon sheet having a thickness of not more than 500 $\mu$m between the semiconductor wafer-holding member and the cooling equipment, while sandwiched by them, and combining, by fastening them mechanically, the semiconductor wafer-holding member, the cooling equipment, and the intervened layer.

5. A method for using a semiconductor wafer-holder having a semiconductor wafer-holding member with a basic member made of a ceramic nitride, a cooling equipment made of a metal, and an intervened layer composed of a metallic foil or a carbon sheet having a thickness of not more than 500 $\mu$m, sandwiched by the semiconductor wafer-holding equipment and the cooling equipment, comprising the steps of:
    controlling a quantity of heat to be transmitted to between the semiconductor wafer-holding member and the cooling equipment by controlling its pressure while pressurizing the intervened layer.

* * * * *